United States Patent
Hoshino

(12) 
(10) Patent No.: US 10,530,298 B2
(45) Date of Patent: Jan. 7, 2020

(54) SEMICONDUCTOR DEVICE, VOLTAGE CONTROLLED OSCILLATOR, LOW PASS FILTER, AND BAND PASS FILTER

(71) Applicants: Kabushiki Kaisha Toshiba, Minato-ku, Tokyo (JP); Toshiba Electronic Devices & Storage Corporation, Minato-ku, Tokyo (JP)

(72) Inventor: Hiroaki Hoshino, Kanagawa (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 0 days.

(21) Appl. No.: 15/904,532

(22) Filed: Feb. 26, 2018

(65) Prior Publication Data
US 2019/0089303 A1 Mar. 21, 2019

(30) Foreign Application Priority Data
Sep. 15, 2017 (JP) .................................. 2017-178356

(51) Int. Cl.
*H03B 5/12* (2006.01)
*H03H 11/04* (2006.01)

(52) U.S. Cl.
CPC ......... *H03B 5/1212* (2013.01); *H03B 5/1228* (2013.01); *H03B 5/1237* (2013.01); *H03H 11/04* (2013.01); *H03B 2200/004* (2013.01)

(58) Field of Classification Search
CPC .................................................... H05B 5/1212
USPC ...................................................... 331/117 FE
See application file for complete search history.

(56) References Cited

U.S. PATENT DOCUMENTS

| 4,082,961 A * | 4/1978 | Genuit ................. H03K 17/292 307/141 |
| 6,272,030 B1 * | 8/2001 | Oomura .................. H02M 7/06 363/62 |
| 2005/0168296 A1 * | 8/2005 | Schulz ..................... H03B 5/14 331/175 |
| 2007/0296511 A1 | 12/2007 | Holuigue et al. |
| 2010/0013567 A1 | 1/2010 | Tomita |

(Continued)

FOREIGN PATENT DOCUMENTS

| JP | 2007-336552 A | 12/2007 |
| JP | 2009-253401 A | 10/2009 |
| WO | 2008-114455 A1 | 9/2008 |

*Primary Examiner* — Joseph Chang
(74) *Attorney, Agent, or Firm* — White & Case LLP

(57) ABSTRACT

According to one embodiment, there is provided a semiconductor device including a first switch, a first capacitive element, a second capacitive element, a first rectifying circuit, a second rectifying circuit, a third rectifying circuit, and a fourth rectifying circuit. The first switch is electrically inserted between a first node and a second node. The first capacitive element is electrically inserted between a first signal node and the first node. The second capacitive element is electrically inserted between a second signal node and the second node. The first rectifying circuit is electrically connected to the first node with a first polarity. The second rectifying circuit is electrically connected to the first node with a second polarity opposite to the first polarity. The third rectifying circuit is electrically connected to the second node with the first polarity. The fourth rectifying circuit is electrically connected to the second node with the second polarity.

19 Claims, 9 Drawing Sheets

(56) References Cited

U.S. PATENT DOCUMENTS

2012/0268221 A1* 10/2012 Czimmek .............. F02M 53/06
331/117 R
2013/0335149 A1* 12/2013 Athas ................... H03B 5/1228
331/8

* cited by examiner

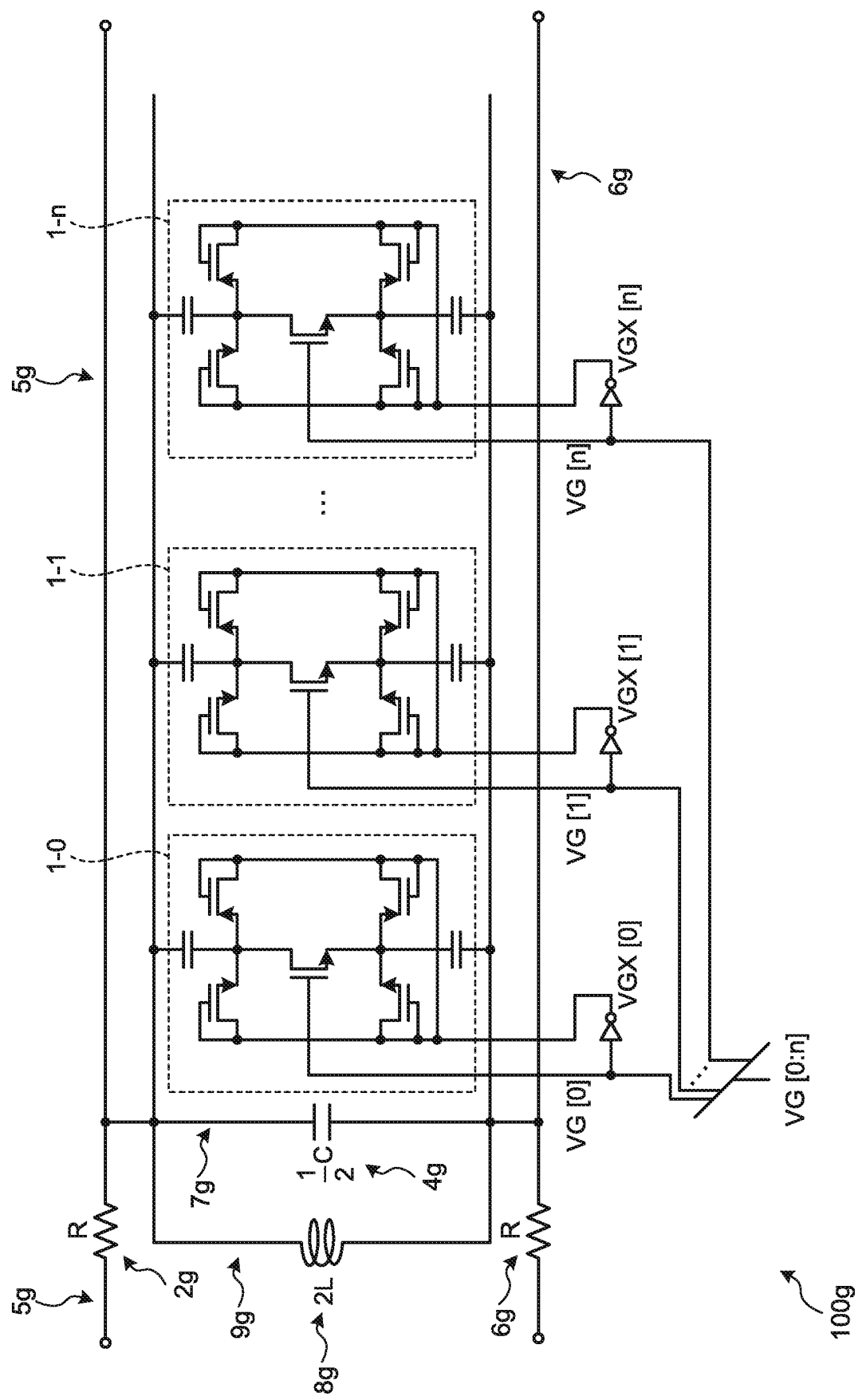

US 10,530,298 B2

SEMICONDUCTOR DEVICE, VOLTAGE CONTROLLED OSCILLATOR, LOW PASS FILTER, AND BAND PASS FILTER

CROSS-REFERENCE TO RELATED APPLICATIONS

This application is based upon and claims the benefit of priority from Japanese Patent Application No. 2017-178356, filed on Sep. 15, 2017; the entire contents of which are incorporated herein by reference.

FIELD

Embodiments described herein relate generally to a semiconductor device, a voltage controlled oscillator, a low pass filter, and a band pass filter.

BACKGROUND

Semiconductor devices including a capacitive element can implement a certain operation by charging/discharging charges to/from the capacitive element. In this case, it is preferable to operate the semiconductor device stably.

BRIEF DESCRIPTION OF THE DRAWINGS

FIGS. 4A and 4B are diagrams illustrating an operation of the semiconductor device according to the embodiment when a switch is turned on;

FIG. 9 is a circuit diagram illustrating a configuration of a band pass filter to which a semiconductor device according to another modified example of the embodiment is applied.

DETAILED DESCRIPTION

In general, according to one embodiment, there is provided a semiconductor device including a first switch, a first capacitive element, a second capacitive element, a first rectifying circuit, a second rectifying circuit, a third rectifying circuit, and a fourth rectifying circuit. The first switch is electrically inserted between a first node and a second node. The first capacitive element is electrically inserted between a first signal node and the first node. The second capacitive element is electrically inserted between a second signal node and the second node. The first rectifying circuit is electrically connected to the first node with a first polarity. The second rectifying circuit is electrically connected to the first node with a second polarity opposite to the first polarity. The third rectifying circuit is electrically connected to the second node with the first polarity. The fourth rectifying circuit is electrically connected to the second node with the second polarity.

Exemplary embodiments of a semiconductor device will be explained below in detail with reference to the accompanying drawings. The present invention is not limited to the following embodiments.

Embodiment

A semiconductor device 1 according to an embodiment will be described. The semiconductor device 1 includes a capacitive element and can implement a certain operation by charging/discharging charges to/from the capacitive element and generating a desired capacitance value. For example, a plurality of semiconductor devices 1-0 to 1-$n$ can be connected to an inductor 2, and an LC resonance operation can be implemented by the inductor 2 and the capacitive element. Further, a voltage controlled oscillator 100 can be configured by connecting an LC resonant circuit in which a plurality of semiconductor devices 1-0 to 1-$n$ and the inductor 2 are connected with a certain circuit.

Figure 1:
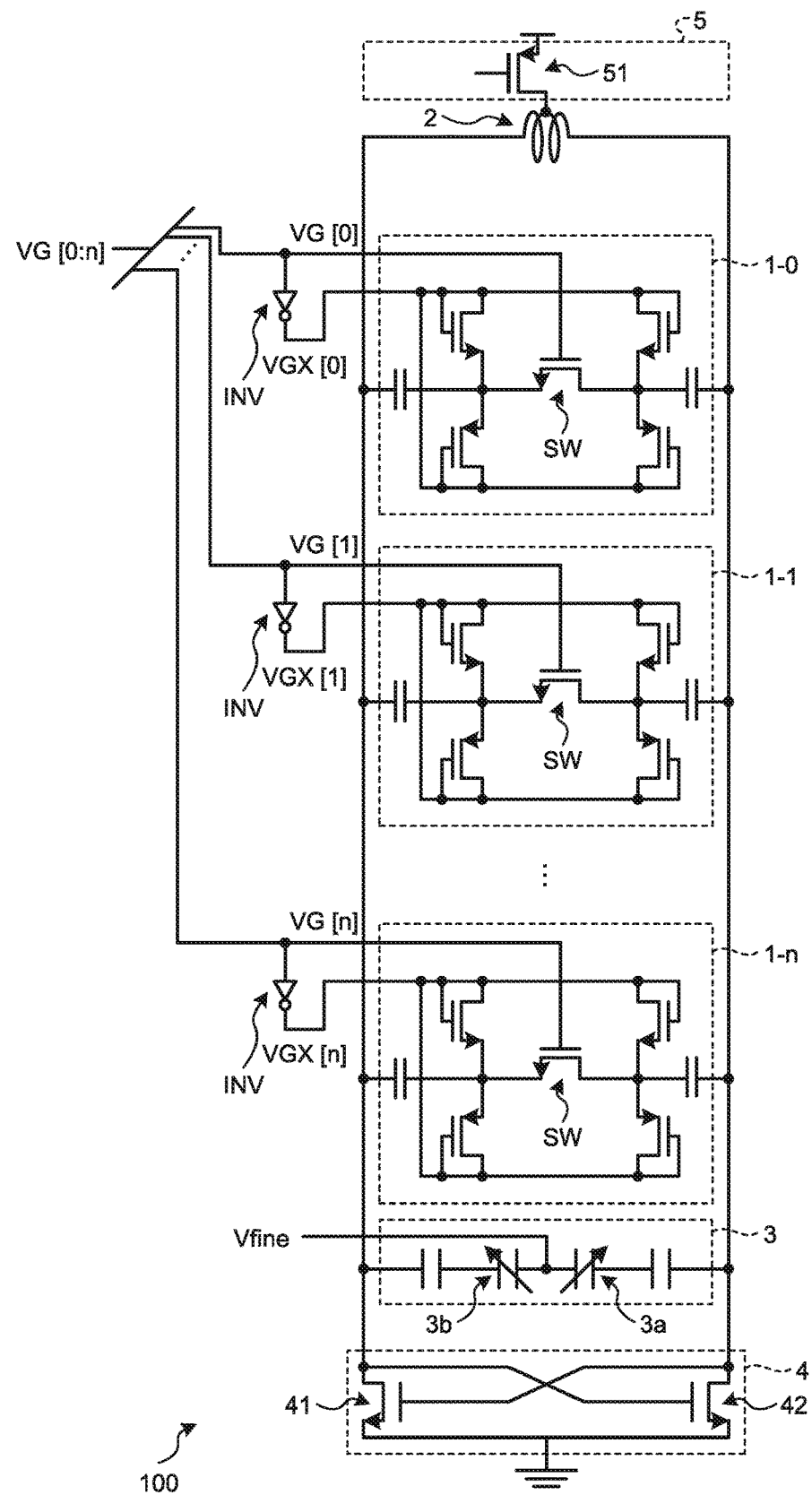
FIG. 1 is a circuit diagram illustrating a configuration of a voltage controlled oscillator to which a semiconductor device according to an embodiment is applied.

For example, as illustrated in FIG. 1, the voltage controlled oscillator 100 includes a plurality of semiconductor devices 1-0 to 1-$n$, the inductor 2, a fine adjustable capacitive unit 3, a negative resistive unit 4, and a bias current supply unit 5. FIG. 1 is a circuit diagram illustrating a configuration of the voltage controlled oscillator 100 to which the semiconductor devices 1-0 to 1-$n$ are applied.

Figure 2:
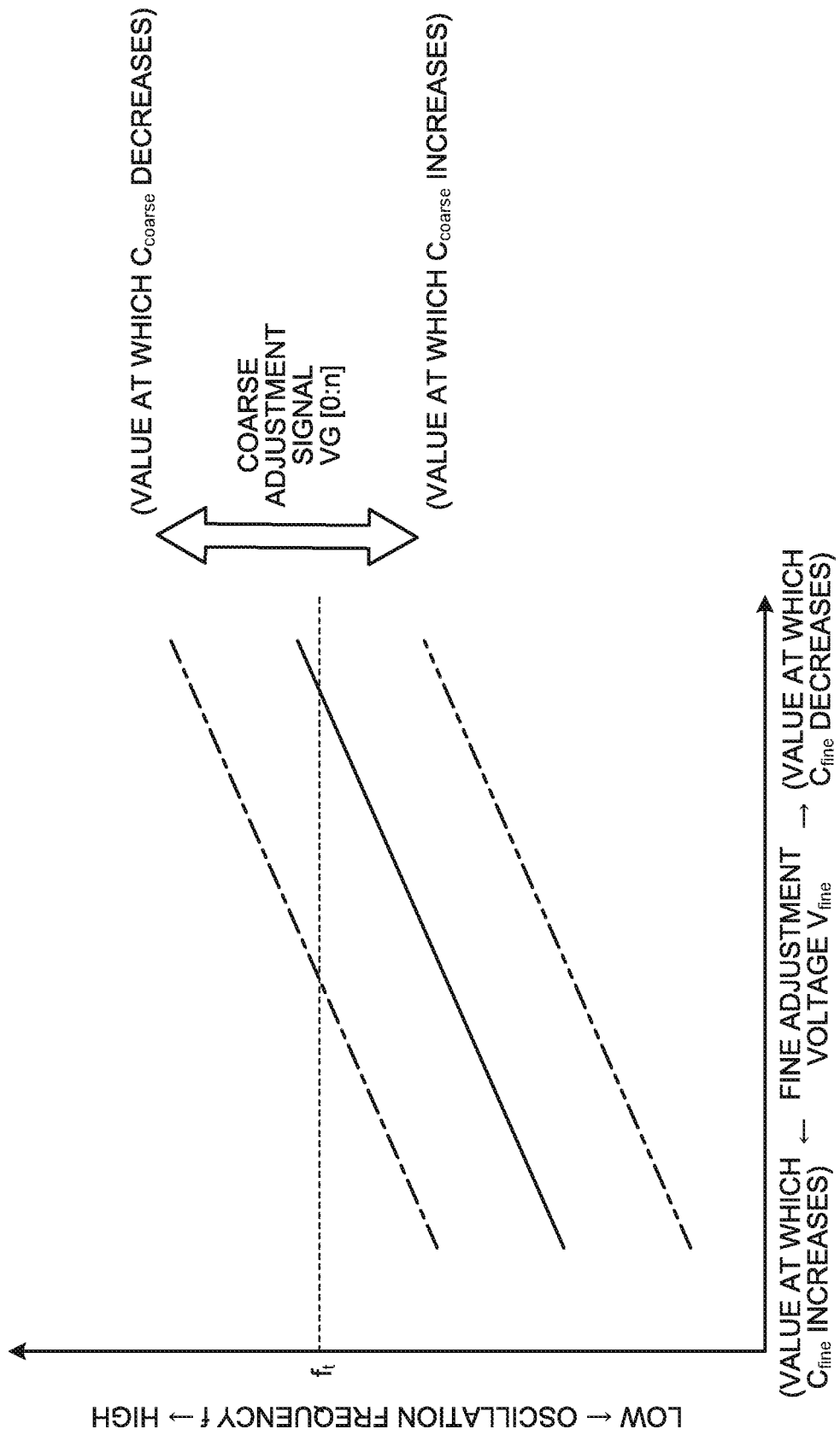
FIG. 2 is a diagram illustrating an operation of the voltage controlled oscillator to which the semiconductor device according to the embodiment is applied.

The voltage controlled oscillator 100 is applied to, for example, a phase locked loop (PLL) circuit and can be configured to perform an oscillation operation at an oscillation frequency corresponding to a control voltage generated by the PLL circuit. For example, the inductor 2 and each of the semiconductor devices 1-0 to 1-$n$ illustrated in FIG. 1 constitute a coarse adjustable LC resonant circuit that coarsely adjusts the oscillation frequency of the voltage controlled oscillator 100. The inductor 2 and the fine adjustable capacitive unit 3 constitute a fine adjustable LC resonant circuit that finely adjusts the oscillation frequency of the voltage controlled oscillator 100. Accordingly, as illustrated in FIG. 2, the oscillation frequency of the voltage controlled oscillator 100 can be adjusted to a target frequency $f_t$. FIG. 2 is a diagram illustrating an operation of the voltage controlled oscillator 100.

For example, if an inductance value of the inductor 2 is indicated by L and a combined capacitance value contributing to the oscillation operation of the voltage controlled oscillator 100 is indicated by $C_{total}$, the oscillation frequency F of the voltage controlled oscillator 100 is indicated by the following Formula 1.

$$F = 1/\{2\sqrt{(L \times C_{total})}\} \quad \text{Formula 1}$$

In this case, if a capacitance value in the coarse adjustable LC resonant circuit is indicated by $C_{coarse}$, a capacitance value in the fine adjustable LC resonant circuit is indicated by $C_{fine}$, and a parasitic capacitance between the inductor 2 and the negative resistive unit 4 is indicated by $C_{parasitic}$, the combined capacitance value $C_{total}$ contributing to the oscillation operation of the voltage controlled oscillator 100 is indicated by the following Formula 2.

$$C_{total} = C_{coarse} + C_{fine} + C_{parasitic} \quad \text{Formula 2}$$

In the coarse adjustable LC resonant circuit, the inductor 2 and a plurality of semiconductor devices 1-0 to 1-$n$ are connected in parallel, and the capacitance value $C_{coarse}$ in the coarse adjustable LC resonant circuit is adjusted by varying the number of the semiconductor devices 1 to enter an active state among a plurality of semiconductor devices 1-0 to 1-$n$. The coarse adjustment of the oscillation frequency F by the adjustment of the capacitance value $C_{coarse}$ can be performed by changing a coarse adjustment control signal (a coarse adjustment signal) VG[0:n] as illustrated in FIG. 2. In other words, if n is an arbitrary integer of 0 or more, as illustrated in FIG. 1, (n+1) coarse adjustment signals (first control signals) VG[0:n] correspond to (n+1) semiconductor devices 1-0 to 1-$n$. It is possible to vary the number of semiconductor devices 1 to enter the active state among a plurality of semiconductor devices 1-0 to 1-$n$ by varying the number of control signals to enter an active level in the (n+1) control signals VG[0:n]. For example, if a capacitance value is indicated by C(k), and a function f(k) that becomes 1 when the semiconductor device 1-$k$ is in the active state and becomes 0 when the semiconductor device 1-$k$ is in the non-active state is defined for a k-th semiconductor device 1-$k$ among a plurality of semiconductor devices 1-0 to 1-$n$, the capacitance value $C_{coarse}$ in the coarse adjustable LC resonant circuit is indicated by the following Formula 3.

$$C_{coarse}=f(0)\times C(0)+f(1)\times C(1)+\ldots+f(n)\times C(n) \qquad \text{Formula 3}$$

In the fine adjustable LC resonant circuit, the inductor 2 and the fine adjustable capacitive unit 3 are connected, variable capacitive elements 3a and 3b are included in the fine adjustable capacitive unit 3, and the capacitance value $C_{fine}$ in the fine adjustable LC resonant circuit is adjusted by varying capacitance values of the variable capacitive elements 3a and 3b. The fine adjustment of the oscillation frequency F by the adjustment of the capacitance value $C_{fine}$ can be performed by changing a fine adjustment control voltage (a fine adjustment voltage) $V_{fine}$ as illustrated in FIG. 2. In other words, as illustrated in FIG. 1, if the fine adjustment voltage $V_{fine}$ is supplied to a common connection end of an electrode of one of the variable capacitive elements 3a and 3b, and the value of fine adjustment voltage $V_{fine}$ is varied, it is possible to vary the capacitance values of the variable capacitive elements 3a and 3b included in the fine adjustable capacitive unit 3.

NNOS transistors 41 and 42 which are cross-couple connected in the negative resistive unit 4 operate as negative resistors. The losses of the coarse adjustable LC resonant circuit and the fine adjustable LC resonant circuit are compensated by the cross-couple connected NMOS transistors 41 and 42, and the voltage controlled oscillator 100 oscillates at a frequency determined by a resonance frequency of the LC resonant circuit. In FIG. 1, a control signal VGX[0:n] is generated by logically inverting the control signal VG[0:n] through an inverter INV.

The bias current supply unit 5 includes a bias transistor 51 and supplies a bias current so that the resonance operation performed by the LC resonant circuit is maintained.

In the voltage controlled oscillator 100, each of the semiconductor devices 1-0 to 1-$n$ includes a switch SW and is configured to be able to switch between the active state and the non-active state by turning the switch SW on or off. In other words, as indicated in Formula 3, since the capacitance value $C_{coarse}$ for the coarse adjustment is adjusted by turning the switch SW on and varying the number of the semiconductor devices 1 to enter the active state among the semiconductor devices 1-0 to 1-$n$, it is possible to easily expand a frequency band by increasing the number (n+1) of semiconductor devices 1.

In this case, in order to stabilize the oscillation operation of the voltage controlled oscillator 100, it is preferable to stabilize the LC resonance operation of the coarse adjustable LC resonant circuit. In other words, it is preferable to operate the semiconductor device 1 stably to generate a desired capacitance value. In a case in which the switch SW is configured with an MOS transistor, each semiconductor device 1 increases a gate-source voltage Vgs when the switch SW is turned on and decreases a parasitic capacitance between a drain and the source when the switch SW is turned off, and thus an inverted signal is biased to the gate, the source, and the drain.

In order to realize above situation, bias technique by a resistor may be used. In other words, a resistive element is electrically inserted between the control node and a source and a drain, and a bias is applied to the control node. In this case, a higher impedance (for example, several kΩ) than the LC resonant circuit is necessary, and the resistance value of the resistive element needs to be increased, and thus a layout area of the resistive element is likely to be increased. Further, since the voltage controlled oscillator 100 has a layout in which a plurality of semiconductor devices 1-0 to 1-$n$ are arranged, if the layout area of the resistive element in each semiconductor device 1 is large, the layout area of the voltage controlled oscillator 100 is likely to be greatly increased. In addition, since a wiring connected to the resistive element in each semiconductor device 1 is increased in length, an R/L/C parasitic component of the wiring is likely to be increased.

In this regard, the present embodiment performing a high impedance connection between the control node and both ends of the switch SW through a rectifying circuit instead of the resistive element so as to reduce the layout area while maintaining the stable operation of the semiconductor device 1.

Figure 3:
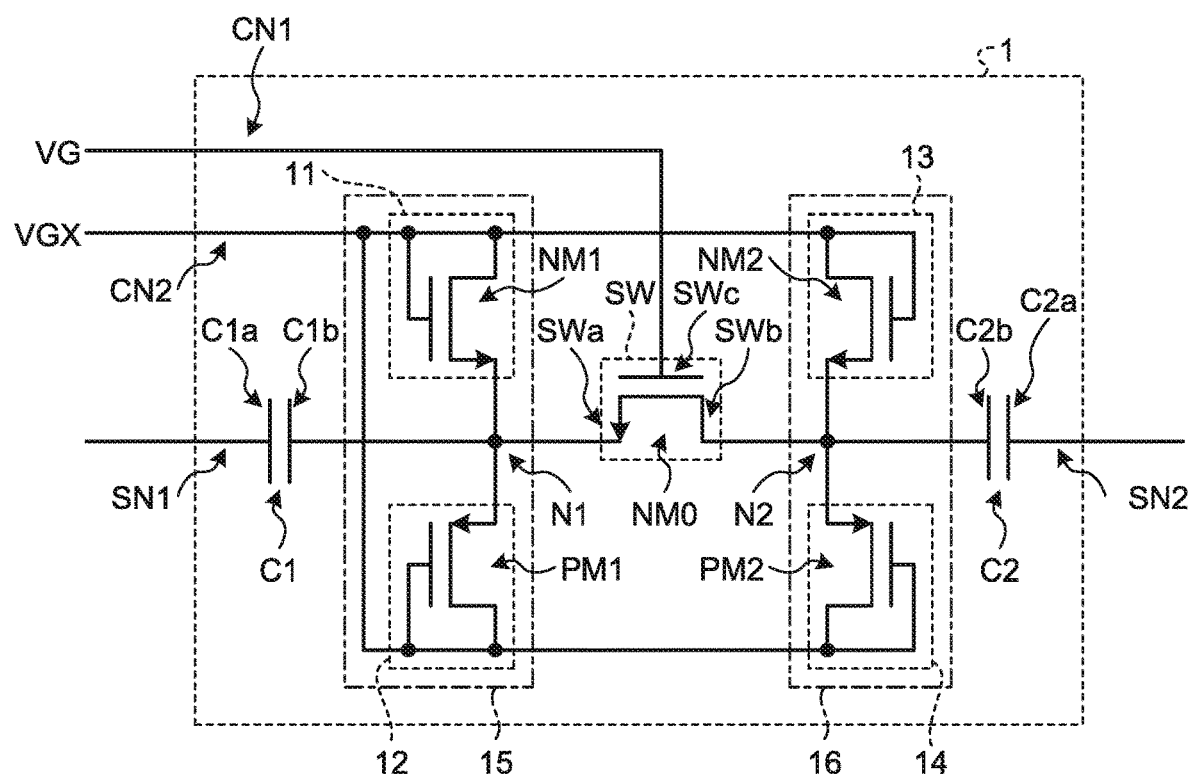
FIG. 3 is a circuit diagram illustrating a configuration of the semiconductor device according to the embodiment.

Specifically, each of the semiconductor devices 1-0 to 1-$n$ is configured as illustrated in FIG. 3. FIG. 3 is a diagram illustrating a configuration of the semiconductor device 1. In other words, since each of the semiconductor devices 1-0 to 1-$n$ has an equivalent structure, one of the semiconductor devices 1-0 to 1-$n$ is indicated by the semiconductor device 1, any one of VG[0] to VG[n] is indicated by VG, and any one of VGX[0] to VGX[n] is indicated by VGX in FIG. 3.

The semiconductor device 1 is electrically inserted between a signal node SN1 and a signal node SN2. In a case in which the semiconductor device 1 is applied to the voltage controlled oscillator 100 (see FIG. 1), one end of the inductor 2 is electrically connected to the signal node SN1, and the other end of the inductor 2 is electrically connected to the signal node SN2.

The semiconductor device 1 includes a switch (first switch) SW, a capacitive element (first capacitive element) C1, a capacitive element (second capacitive element) C2, a rectifying circuit (first rectifying circuit) 11, a rectifying circuit (second rectifying circuit) 12, a rectifying circuit (third rectifying circuit) 13, and a rectifying circuit (fourth rectifying circuit) 14.

The switch SW is electrically inserted between a node N1 and a node N2. In the switch SW, one end SWa is electrically connected to the capacitive element C1 via the node N1, the other end SWb is electrically connected to the capacitive element C2 via the node N2, and a control terminal SWc is electrically connected to a control node (a first control node) CN1. The control terminal SWc of the switch SW receives a control signal VG via the control node CN1.

The switch SW includes, for example, an NMOS transistor NM0. In the NMOS transistor NM0, a source constitutes one end SWa of the switch SW, a drain constitutes the other end SWb of the switch SW, and a gate constitutes the control terminal SWc of the switch SW. In the NMOS transistor NM0, the source is electrically connected to the capacitive element C1 via the node N1, the drain is electrically connected to the capacitive element C2 via the node N2, and the gate is electrically connected to the control node CN1. The gate of the NMOS transistor NM0 receives the control signal VG via the control node CN1.

The capacitive element C1 is electrically inserted between the signal node SN1 and one end SWa of the switch SW. In the capacitive element C1, one end C1a is electrically connected to the signal node SN1, and the other end C1b is electrically connected to one end SWa of the switch SW via the node N1.

The capacitive element C2 is electrically inserted between the signal node SN2 and the other end SWb of the switch SW. In the capacitive element C2, one end C2a is electrically connected to the signal node SN2, and the other end C2b is electrically connected to the other end SWb of the switch SW via the node N2.

The rectifying circuit 11 is electrically connected to the node (first node) N1. The node N1 is a node between the capacitive element (first capacitive element) C1 and one end SWa of the switch SW. The rectifying circuit 11 is electrically inserted between a control node CN2 and the node N1. The rectifying circuit 11 is connected to the node N1 with a polarity (first polarity) of rectifying from the control node (second control node) CN2 to the node N1.

The rectifying circuit 11 includes, for example, an NMOS transistor (first NMOS transistor) NM1. The NMOS transistor NM1 is diode-connected. In the NMOS transistor NM1, a gate and a drain are electrically connected to each other and also electrically connected to the control node CN2. In the NMOS transistor NM1, a source is electrically connected to the node N1.

The rectifying circuit 12 is electrically connected to the node N1. The rectifying circuit 12 is electrically inserted between the control node CN2 and the node N1. The rectifying circuit 12 is connected to the node N1 with a polarity (second polarity) of rectifying from the node N1 to the control node CN2.

The rectifying circuit 12 includes, for example, a PMOS transistor (first PMOS transistor) PM1. The PMOS transistor PM1 is diode-connected. In the PMOS transistor PM1, a gate and a drain are electrically connected to each other and also electrically connected to the control node CN2. In the PMOS transistor PM1, a source is electrically connected to the node N1.

The rectifying circuit 11 and the rectifying circuit 12 can be regarded as constituting a bias circuit 15 that complementarily applies a bias voltage to the one end SWa side of the switch SW in accordance with an on/off operation of the switch SW.

The rectifying circuit 13 is electrically connected to the node (second node) N2. The node N2 is a node between the capacitive element (second capacitive element) C2 and the other end SWb of the switch SW. The rectifying circuit 13 is electrically inserted between the control node CN2 and the node N2. The rectifying circuit 13 is connected to the node N2 with a polarity (first polarity) of rectifying from the control node CN2 to the node N2.

The rectifying circuit 13 includes, for example, an NMOS transistor (second NMOS transistor) NM2. The NMOS transistor NM2 is diode-connected. In the NMOS transistor NM2, a gate and a drain are electrically connected to each other and also electrically connected to the control node CN2. In the NMOS transistor NM2, a source is electrically connected to the node N2.

The rectifying circuit 14 is electrically connected to the node N2. The rectifying circuit 14 is electrically inserted between the control node CN2 and the node N2. The rectifying circuit 14 is connected to the node N2 with a polarity (second polarity) of rectifying from the node N2 to the control node CN2.

The rectifying circuit 14 includes, for example, a PMOS transistor (second PMOS transistor) PM2. The PMOS transistor PM2 is diode-connected. In the PMOS transistor PM2, a gate and a drain are electrically connected to each other and are electrically connected to the control node CN2. In the PMOS transistor PM2, a source is electrically connected to the node N2.

The rectifying circuit 13 and the rectifying circuit 14 can be regarded as constituting a bias circuit 16 that complementarily applies a bias voltage to the other end SWb side of the switch SW in accordance with an on/off operation of the switch SW.

In the semiconductor device 1, the high impedance connection between the control node and both ends of the switch SW is performed through the rectifying circuits 11 to 14. For example, the diode-connected transistors NM1, PM1, NM2, and PM2 can implement a high impedance similar to the resistive element with an area smaller than the resistive element. Accordingly, it is possible to implement the high impedance connection between the control node and both ends of the switch SW with a smaller area than in the case of the resistor bias.

Figure 4A:
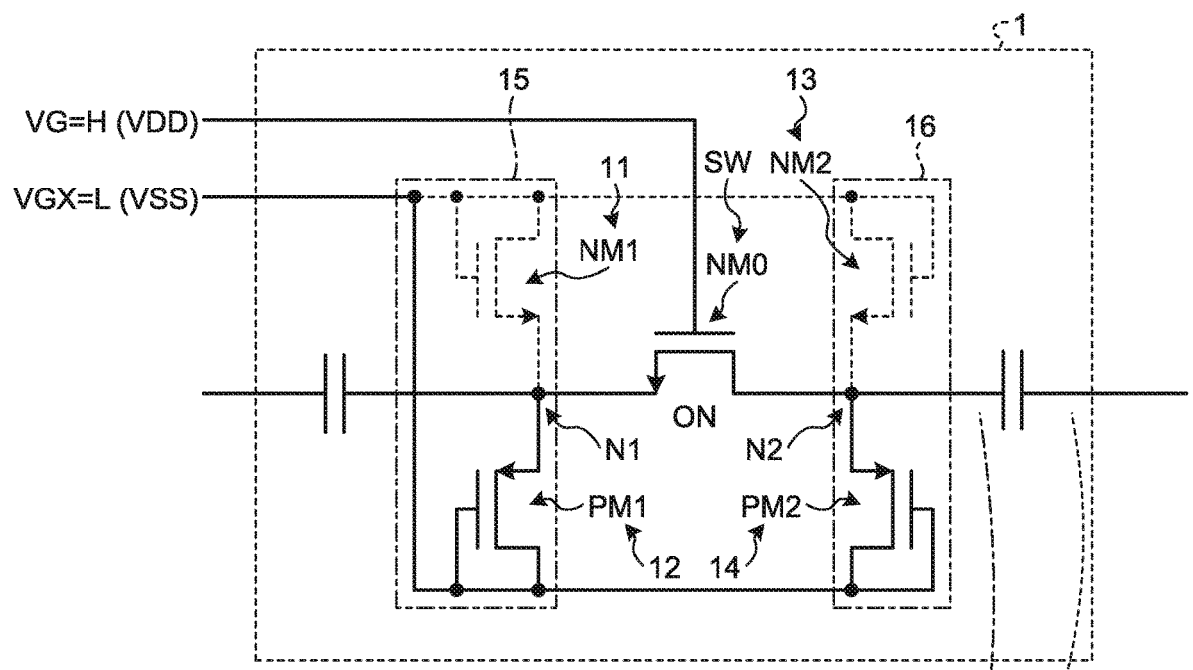
Figure 4B:
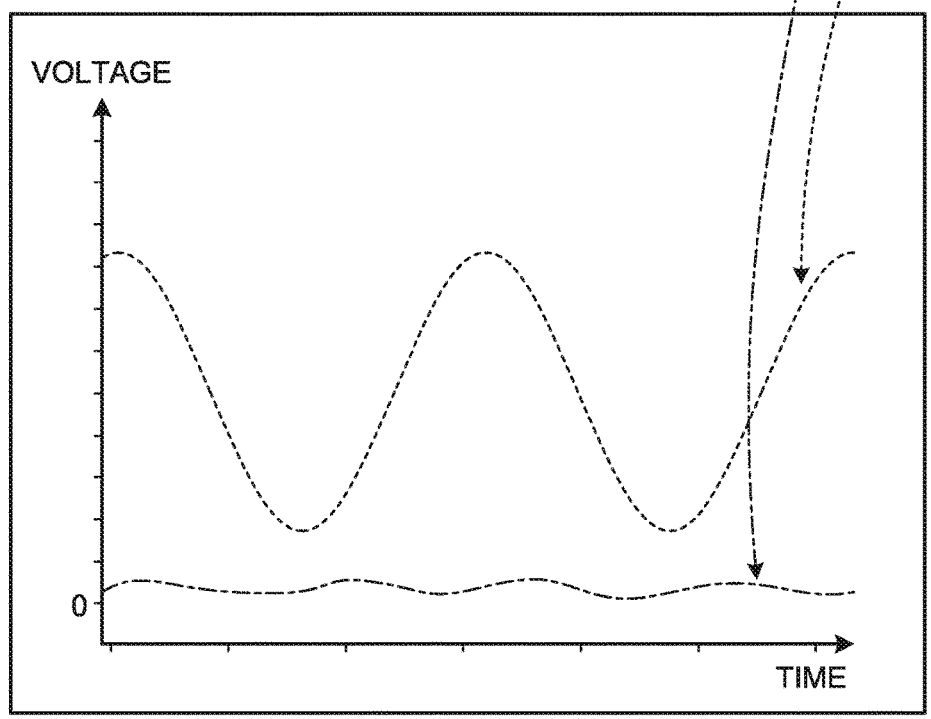

Next, an operation of the semiconductor device 1 in a state in which the switch SW is turned on will be described with reference to FIGS. 4A and 4B. FIG. 4A is a circuit diagram illustrating an operation of the semiconductor device 1 when the switch is turned on, and FIG. 4B is a waveform diagram illustrating an operation of the semiconductor device 1 when the switch is turned on.

If the control signal (coarse adjustment signal) VG transitions to a H level (VDD level), the switch SW is turned on, and the node N1 and the node N2 are electrically conducted.

Further, the control signal VGX generated by logically inverting the control signal VG through the inverter INV (see FIG. 1) transitions to an L level (VSS level).

In response to this, a gate voltage of the NMOS transistor NM1 of the rectifying circuit 11 out of the two rectifying circuits 11 and 12 in the bias circuit 15 transitions to the L level and is inactivated as indicated by a broken line in FIG. 4A, but a gate voltage of the PMOS transistor PM1 of the rectifying circuit 12 transitions to the L level and is activated as indicated by a solid line in FIG. 4A. Accordingly, as illustrated in FIG. 4B, the node N1 can be biased to a low potential (a level corresponding to the L level, for example, about 0 V). At the same time, the voltage difference between both ends of the rectifying circuit 12 (the PMOS transistor PM1) become an ON voltage (about 0.4 V) or less and can be kept in an OFF state.

Similarly, a gate voltage of the NMOS transistor NM2 of the rectifying circuit 13 out of the two rectifying circuits 13 and 14 in the bias circuit 16 transitions to the L level and is inactivated as indicated by a broken line in FIG. 4A, but a gate voltage of the PMOS transistor PM2 of the rectifying circuit 14 transitions to the L level and is activated as indicated by a solid line in FIG. 4A. Accordingly, as illustrated in FIG. 4B, the node N2 can be biased to a low potential (a level corresponding to the L level, for example, about 0 V). At the same time, the voltage difference between both ends of the rectifying circuit 14 (the PMOS transistor PM2) becomes an ON voltage (about 0.4 V) or less and can be kept in the OFF state.

In other words, it is possible to increase the potential of the gate while decreasing the potential of to source/drain of the switch SW (the NMOS transistor NM0), and it is possible to decrease an ON resistance by increasing Vgs of the switch SW.

Further, since the diode-connected PMOS transistors PM1 and PM2 are in an OFF region, PMOS transistors PM1 and PM2 have the high impedance and have little influence on the resonance operation of the LC resonant circuit. In the state in which the switch SW is turned on, the nodes N1 and N2 act as a virtual ground for the LC resonant circuit, and the impedance of the bias circuits 15 and 16 can be regarded as having little influence on the resonance operation of the LC resonant circuit.

Figure 5A:
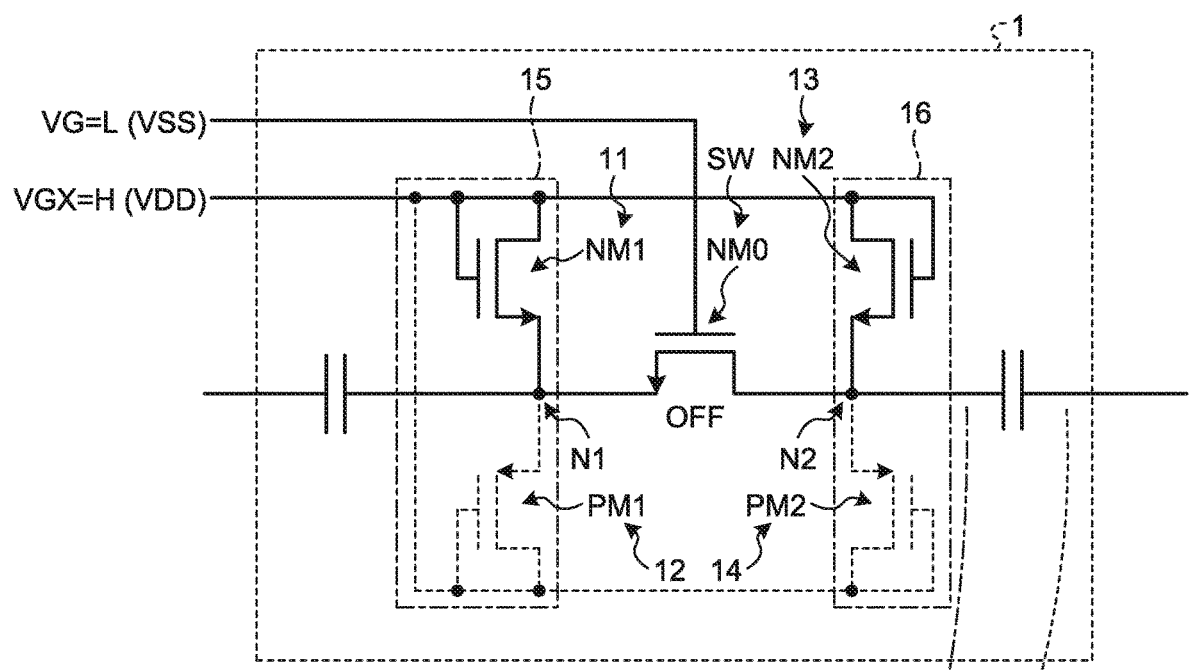
FIGS. 5A and 5B are diagrams illustrating an operation of the semiconductor device according to the embodiment when a switch is turned off.
Figure 5B:
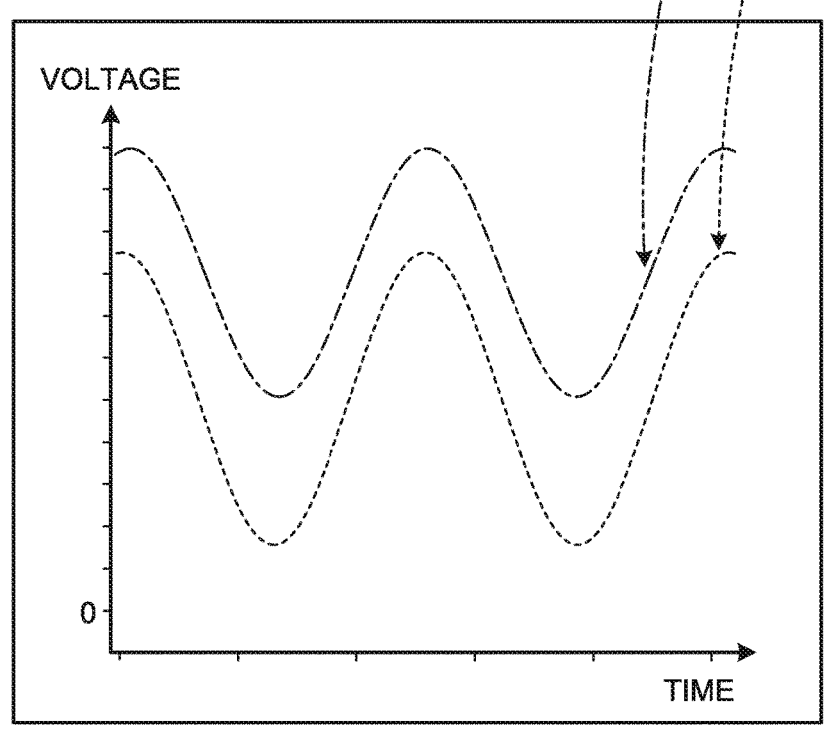

Next, an operation of the semiconductor device in a state in which the switch SW is turned off will be described with reference to FIGS. 5A and 5B. FIG. 5A is a circuit diagram illustrating an operation of the semiconductor device 1 when the switch is turned off, and FIG. 5B is a waveform diagram illustrating an operation of the semiconductor device 1 when the switch is turned off.

If the control signal (coarse adjustment signal) VG transitions to the L level (VSS level), the switch SW is turned off, and the node N1 and the node N2 are electrically disconnected.

Further, the control signal VGX generated by logically inverting the control signal VG through the inverter INV (see FIG. 1) transitions to the H level (VDD level).

In response to this, a gate voltage of the PMOS transistor PM1 of the rectifying circuit 12 out of the two rectifying circuits 11 and 12 in the bias circuit 15 transitions to the H level and is inactivated as indicated by a broken line in FIG. 5A, but a gate voltage of the NMOS transistor NM1 of the rectifying circuit 11 transitions to the H level and is activated as indicated by a solid line in FIG. 5A. Accordingly, as illustrated in FIG. 5B, a DC voltage of the node N1 can be biased to a high potential (a level corresponding to the H level, for example, about 0.95 V). At the same time, if a voltage amplitude of the resonance operation performed by the LC resonant circuit is within an appropriate range, the voltage difference between both ends of the rectifying circuit 11 (NMOS transistor NM1) becomes an ON voltage (about 0.4 V) or less and can be kept in the OFF state.

Similarly, a gate voltage of the PMOS transistor PM2 of the rectifying circuit 14 out of the two rectifying circuits 13 and 14 in the bias circuit 16, transitions to the H level and is inactivated as indicated by a broken line in FIG. 5A, but a gate voltage of the NMOS transistor NM2 of the rectifying circuit 13 transitions to the H level and is activated as indicated by a solid line in FIG. 5A. Accordingly, as illustrated in FIG. 5B, the DC voltage of node N2 can be biased to a high potential (a level corresponding to the H level, for example, about 0.95 V). At the same time, if the voltage amplitude of the resonance operation performed by the LC resonant circuit is within an appropriate range, the voltage difference between both ends of the rectifying circuit 13 (the NMOS transistor NM2) becomes an ON voltage (about 0.4 V) or less and can be kept in the OFF state.

In other words, it is possible to decrease the potential of the gate while increasing the potential of the source/drain of the switch SW (the NMOS transistor NM0), and it is possible to reversely bias Vbs and Vbd of the switch SW. Accordingly, it is possible to keep the switch SW in the OFF state even when the voltage amplitude of the resonance operation performed by the LC resonant circuit is a peak, and it is possible to reversely bias a PN junction of the source and the drain (a PN junction between an "N+" type diffusion region and a "P−" type well region) and decrease the parasitic capacitance.

If the voltage amplitude of the resonance operation performed by the LC resonant circuit is within an appropriate range, since the diode connected NMOS transistors NM1 and NM2 are in the OFF region, the diode connected NMOS transistors NM1 and NM2 have the high impedance and have little influence on the resonance operation of the LC resonant circuit.

Figure 6A:
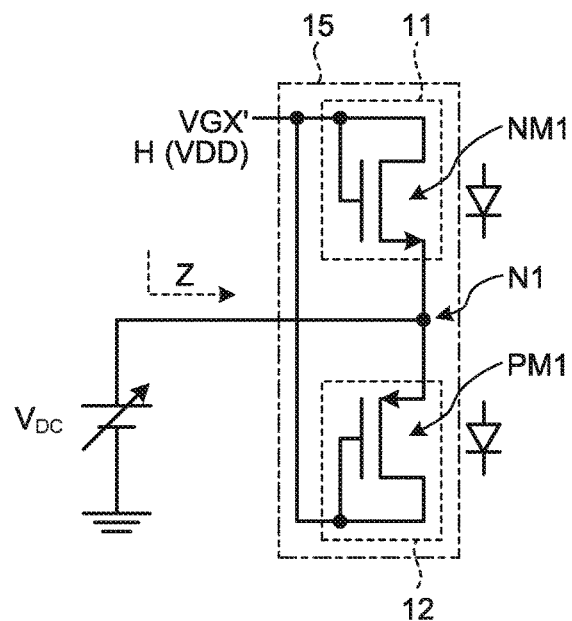
FIGS. 6A and 6B are diagrams illustrating an operation of a bias circuit when a switch is turned off in the embodiment.
Figure 6B:
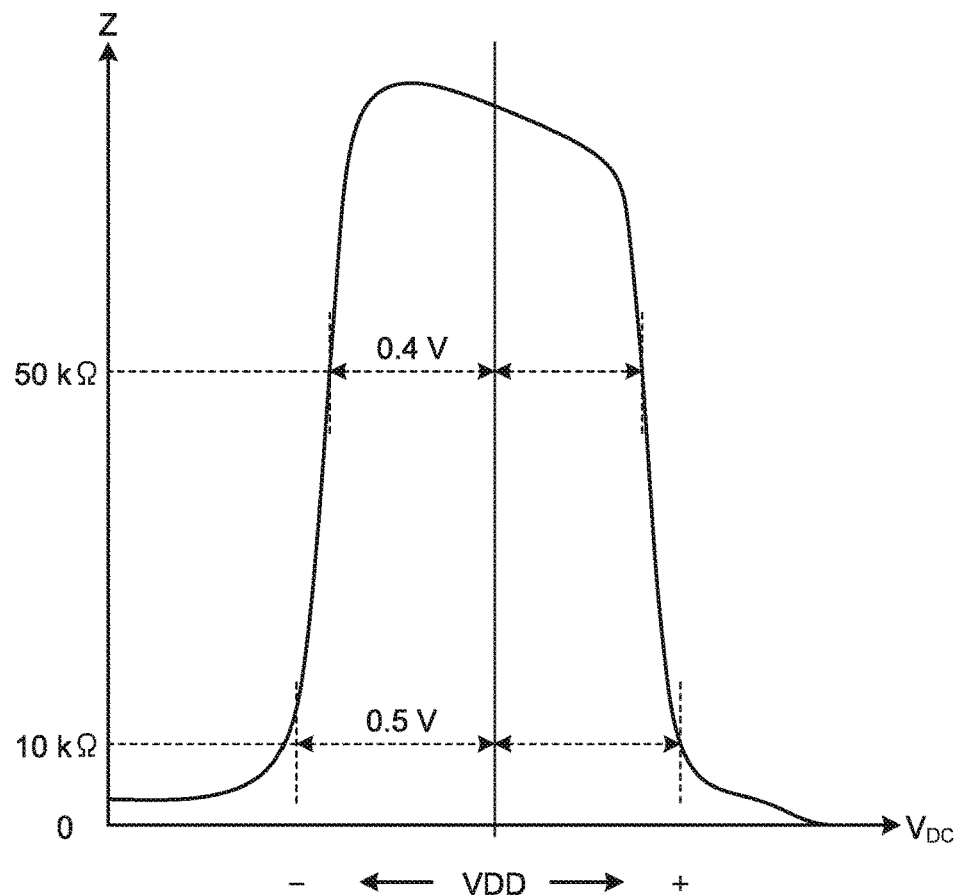

Next, a result of performing impedance analysis (simulation) of the bias circuit 15 in the state in which the switch SW is turned off will be described with reference to FIGS. 6A and 6B. FIGS. 6A and 6B are diagrams illustrating an operation of the bias circuit 15 when the switch is turned off. In this state, as a result of changing a DC voltage $V_{DC}$ applied to the node N1 and analyzing an impedance Z when the node N1 was viewed from a side to which the DC voltage $V_{DC}$ is applied, a result illustrated in FIG. 6B was obtained.

It was confirmed that the rectifying circuit 11 (the diode-connected NMOS transistor NM1) and the rectifying circuit 12 (the diode-connected PMOS transistor PM1) function equivalently as a diode and have a high impedance in a region below an ON voltage as illustrated in FIG. 6B. For example, it was confirmed that the impedance Z of 50 kΩ or more can be obtained when a potential difference from the H level (VDD level) is up to 0.4 V, and the impedance Z of 10 kΩ or more can be obtained when the potential difference from the H level (VDD level) is up to 0.5 V.

As described above, in the present embodiment, in the semiconductor device 1, the high impedance connection between the control node CN2 and both ends of the switch SW is constituted by the rectifying circuits 11 to 14. Accordingly, it is possible to reduce the layout area of the semiconductor device 1 while maintaining the stable operation of the semiconductor device 1.

For example, in a certain process, in order to realize the connection between the control node CN2 and both ends of the switch SW with an impedance of 50 kΩ, in the resistor bias technique, a layout area of 2.4×9 μm² is necessary, but when the technique of the present embodiment is used, the layout area can be reduced to 2.4×1 μm². In other words, when the technique of the present embodiment is applied, the oscillation frequency and the phase noise are substantially equal, and the area of the bias circuit can be reduced to about ⅑.

Figure 7:
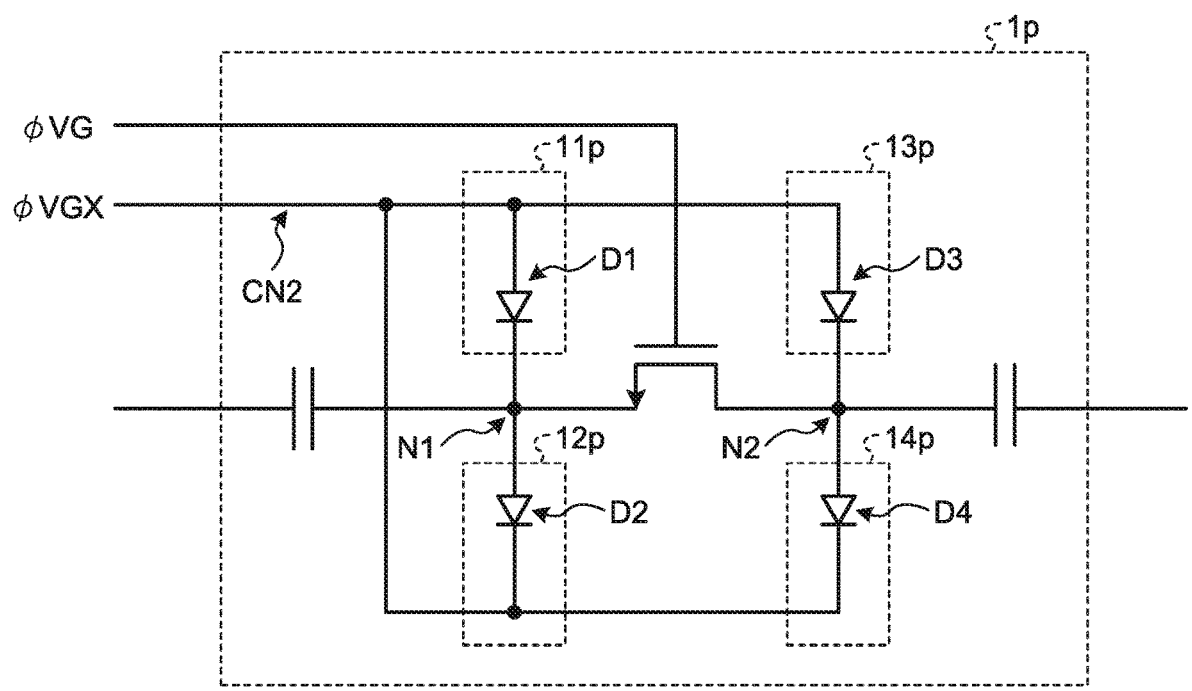
FIG. 7 is a circuit diagram illustrating a configuration of a semiconductor device according to a modified example of the embodiment.

It should be noted that, as illustrated in FIG. 7, rectifying circuits 11p, 12p, 13p, and 14p in a semiconductor device 1p may have diodes D1, D2, D3, and D4, respectively. In the diode D1, a cathode is electrically connected to a node N1, and an anode is electrically connected to a control node CN2. In diode D2, an anode is electrically connected to the node N1, and a cathode is electrically connected to the control node CN2. In the diode D3, a cathode is electrically connected to a node N2, and an anode is electrically connected to the control node CN2. In the diode D4, an anode is electrically connected to the node N2, and a cathode is electrically connected to the control node CN2. Even with such a configuration, it is possible to implement the high impedance connection equivalent to the impedance connection of the resistor bias technique with a layout area smaller than the layout area of the resistor bias technique.

Figure 8:
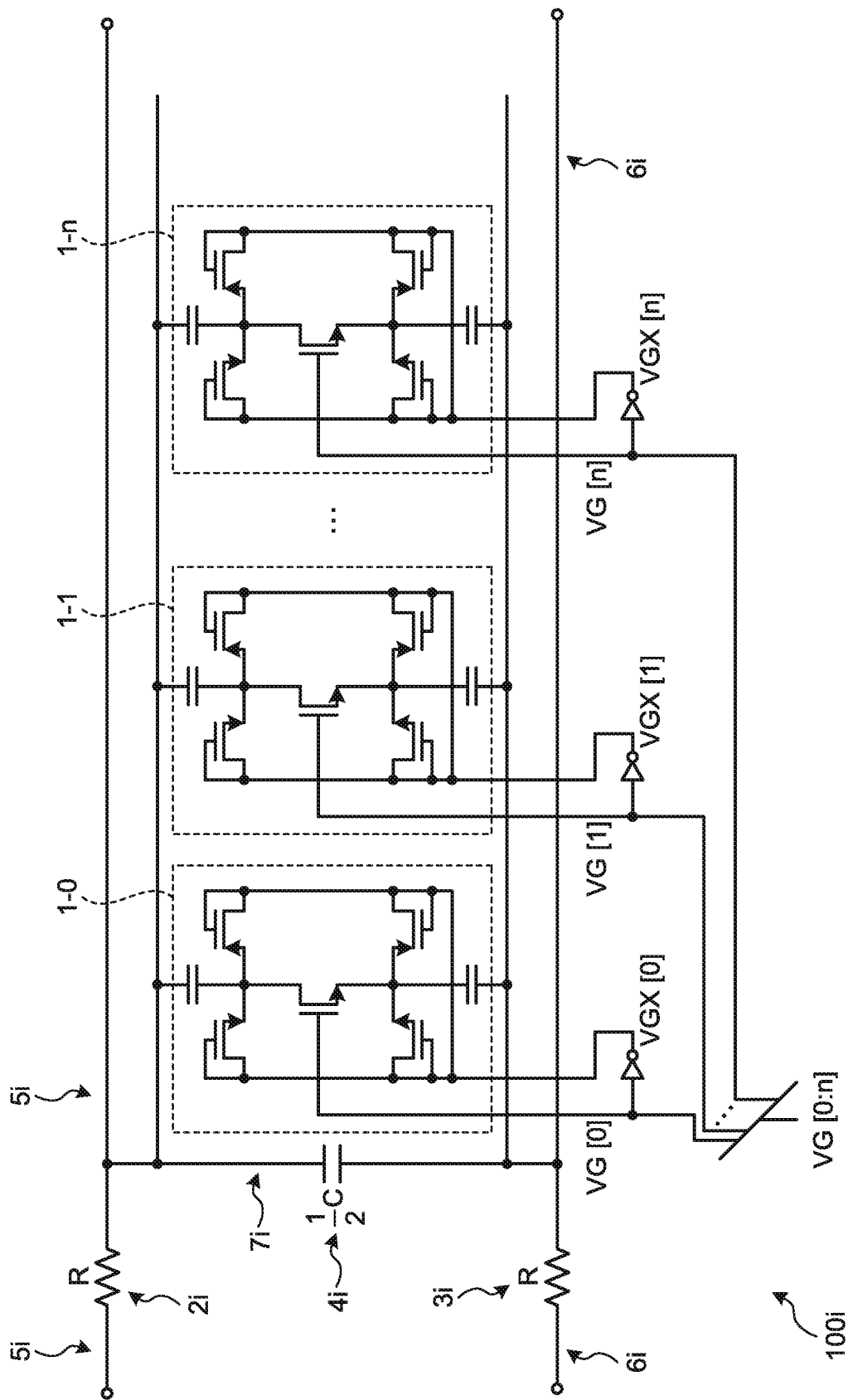
FIG. 8 is a circuit diagram illustrating a configuration of a low pass filter to which a semiconductor device according to another modified example of the embodiment is applied.

Alternatively, a plurality of semiconductor devices 1-0 to 1-n may be applied to a low pass filter 100i as illustrated in FIG. 8. FIG. 8 is a circuit diagram illustrating a configuration of the low pass filter 100$i$ to which a plurality of semiconductor devices 1-0 to 1-$n$ are applied. The low pass filter 100$i$ includes a plurality of semiconductor devices 1-0 to 1-$n$, a resistive element 2$i$, a resistive element 3$i$, and a capacitive element (third capacitive element) 4$i$.

The capacitive element 4$i$ is electrically inserted in a line 7$i$ which electrically connects a line 5$i$ in which the resistive element 2$i$ is electrically inserted and a line 6$i$ in which the resistive element 3$i$ is electrically inserted.

In the low pass filter 100$i$, the capacitive element 4$i$ and a plurality of semiconductor devices 1-0 to 1-$n$ are connected in parallel, and a cutoff frequency thereof is adjusted by changing the number of semiconductor devices to enter the active state among a plurality of semiconductor devices 1-0 to 1-$n$. In other words, if n is an arbitrary integer of 2 or more, (n+1) control signals VG[0:n] correspond to the (n+1) semiconductor devices 1-0 to 1-$n$ as illustrated in FIG. 8. It is possible to vary the number of semiconductor devices 1 to enter the active state among a plurality of semiconductor devices 1-0 to 1-$n$ by varying the number of control signals to enter an active level in the (n+1) control signals VG[0:n].

For example, the resistance values of the resistive elements 2$i$ and 3$i$ are indicated by R, and the capacitance value of the capacitive element 4$i$ is indicated by $\frac{1}{2} \times C$ If a capacitance value is indicated by C(k), and a function f(k) that becomes 1 when the semiconductor device 1-$k$ is in the active state and becomes 0 when the semiconductor device 1-$k$ is in the non-active state is defined for a k-th semiconductor device 1-$k$ among a plurality of semiconductor devices 1-0 to 1-$n$, the cutoff frequency $f_{cutoff}$ of the low pass filter 100$i$ is indicated by the following Formula 4.

$$f_{cutoff}=1/\{2\pi R(C+f(0) \times C(0)+f(1) \times C(1)+\ldots+f(n) \times C(n))\} \quad \text{Formula 4}$$

In this way, it is possible to vary the cutoff frequency $f_{cutoff}$ in the pass band of the low pass filter 100$i$ by changing the number of semiconductor devices 1 to enter the active state among a plurality of semiconductor devices 1-0 to 1-$n$.

Alternatively, a plurality of semiconductor devices 1-0 to 1-$n$ may be applied to a band pass filter 100$j$ as illustrated in FIG. 9. FIG. 9 is a circuit diagram illustrating a configuration of the band pass filter 100$j$ to which a plurality of semiconductor devices 1-0 to 1-$n$ are applied. The band pass filter 100$j$ includes a plurality of semiconductor devices 1-0 to 1-$n$, a resistive element 2$j$, a resistive element 3$j$, an inductance element 8$j$, and a capacitive element (third capacitive element) 4$j$.

A line 7$j$ and a line 9$j$ are connected in parallel between a line 5$j$ in which the resistive element 2$j$ is electrically inserted and a line 6$j$ in which the resistive element 3$j$ is electrically inserted. The capacitive element 4$j$ is electrically inserted in the line 7$j$. The inductance element 8$j$ is electrically inserted in the line 9$j$.

In the band pass filter 100$j$, the capacitive element 4$j$, the inductance element 8$j$, and a plurality of semiconductor devices 1-0 to 1-$n$ are connected in parallel, and a center frequency of the pass band is adjusted by changing the number of semiconductor devices 1 to enter the active state among a plurality of semiconductor devices 1-0 to 1-$n$. In other words, if 'n' is an arbitrary integer of 2 or more, (n+1) control signals VG[0:n] correspond to the (n+1) semiconductor devices 1-0 to 1-$n$ as illustrated in FIG. 9. It is possible to vary the number of semiconductor devices 1 to enter the active state among a plurality of semiconductor devices 1-0 to 1-$n$ by varying the number of control signals to enter an active level in the (n+1) control signals VG[0:n].

For example, the resistance values of the resistive elements 2$j$ and 3$j$ are indicated by R, the inductance value of inductance element 8$j$ is indicated by 2L, and the capacitance value of capacitive element 4$j$ is indicated by $\frac{1}{2} \times C$. If a capacitance value is indicated by C(k), and a function f (k) that becomes 1 when the semiconductor device 1-$k$ is in the active state and becomes 0 when the semiconductor device 1-$k$ is in the non-active state is defined for a k-th semiconductor device 1-$k$ among a plurality of semiconductor devices 1-0 to 1-$n$, the center frequency $f_{center}$ in the pass band of the band pass filter 100$j$ is indicated by the following Formula 5.

$$f_{center}=1/[2\pi\sqrt{\{L \times (C+f(0) \times C(0)+f(1) \times C(1)+\ldots+f(n) \times C(n))\}}] \quad \text{Formula 5}$$

In this way, it is possible to vary the center frequency $f_{center}$ in the pass band of the band pass filter 100$j$ by changing the number of semiconductor devices 1 to enter the active state among a plurality of semiconductor devices 1-0 to 1-$n$.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a first switch that is electrically inserted between a first node and a second node;
    a first capacitive element that is electrically inserted between a first signal node and the first node;
    a second capacitive element that is electrically inserted between a second signal node and the second node;
    a first rectifying circuit that is electrically connected to the first node with a first polarity;
    a second rectifying circuit that is electrically connected to the first node with a second polarity opposite to the first polarity;
    a third rectifying circuit that is electrically connected to the second node with the first polarity; and
    a fourth rectifying circuit that is electrically connected to the second node with the second polarity,
    wherein the first switch includes a control terminal that is electrically connected to a first control node,
    the first rectifying circuit is electrically inserted between the first node and a second control node,
    the second rectifying circuit is electrically inserted between the first node and the second control node,
    the third rectifying circuit is electrically inserted between the second node and the second control node, and
    the fourth rectifying circuit is electrically inserted between the second node and the second control node.

2. The semiconductor device according to claim 1, wherein
    the control terminal of the first switch receives a first control signal via the first control node, and
    the first rectifying circuit, the second rectifying circuit, the third rectifying circuit, and the fourth rectifying circuit receive a second control signal obtained by logically inverting the first control signal via the second control node.

3. The semiconductor device according to claim 1, wherein
the first rectifying circuit includes a first NMOS transistor whose gate and whose drain are electrically connected to each other and whose source is electrically connected to the first node,
the second rectifying circuit includes a first PMOS transistor whose gate and whose drain are electrically connected to each other and whose source is electrically connected to the first node,
the third rectifying circuit includes a second NMOS transistor whose gate and whose drain are electrically connected to each other and whose source is electrically connected to the second node, and
the fourth rectifying circuit includes a second PMOS transistor whose gate and whose drain are electrically connected to each other and whose source is electrically connected to the second node.

4. The semiconductor device according to claim 3, wherein
the first switch has a control terminal that is electrically connected to the first control node,
the first rectifying circuit includes a first NMOS transistor whose gate and whose drain are electrically connected to each other and electrically connected to the second control node and whose source is electrically connected to the first node,
the second rectifying circuit includes a first PMOS transistor whose gate and whose drain are electrically connected to each other and electrically connected to the second control node and whose source is electrically connected to the first node,
the third rectifying circuit includes a second NMOS transistor whose gate and whose drain are electrically connected to each other and electrically connected to the second control node and whose source is electrically connected to the second node, and
the fourth rectifying circuit includes a second PMOS transistor whose gate and whose drain are electrically connected to each other and electrically connected to the second control node and whose source is electrically connected to the second node.

5. The semiconductor device according to claim 1, wherein
the first rectifying circuit includes a first diode whose cathode is electrically connected to the first node,
the second rectifying circuit includes a second diode whose anode is electrically connected to the first node,
the third rectifying circuit includes a third diode whose cathode is electrically connected to the second node, and
the fourth rectifying circuit includes a fourth diode whose anode is electrically connected to the second node.

6. The semiconductor device according to claim 5, wherein
the first switch includes a control terminal that is electrically connected to the first control node,
the first rectifying circuit includes a first diode whose anode is electrically connected to the second control node and whose cathode is electrically connected to the first node,
the second rectifying circuit includes a second diode whose cathode is electrically connected to the second control node and whose anode is electrically connected to the first node,
the third rectifying circuit includes a third diode whose anode is electrically connected to the second control node and whose cathode is electrically connected to the second node, and
the fourth rectifying circuit includes a fourth diode whose cathode is electrically connected to the second control node and whose anode is electrically connected to the second node.

7. The semiconductor device according to claim 6, wherein
the control terminal of the first switch receives a first control signal via the first control node, and
the first rectifying circuit, the second rectifying circuit, the third rectifying circuit, and the fourth rectifying circuit receive a second control signal obtained by logically inverting the first control signal via the second control node.

8. A voltage controlled oscillator, comprising:
a plurality of semiconductor devices, the semiconductor device according to claim 1; and
an inductor element including one end that is electrically connected to a first signal node of each of the plurality of semiconductor devices and the other end that is electrically connected to a second signal node of each of the plurality of semiconductor devices.

9. The voltage controlled oscillator according to claim 8, wherein
the first switch includes a control terminal that is electrically connected to a first control node,
the first rectifying circuit is electrically inserted between the first node and a second control node,
the second rectifying circuit is electrically inserted between the first node and the second control node,
the third rectifying circuit is electrically inserted between the second node and the second control node, and
the fourth rectifying circuit is electrically inserted between the second node and the second control node.

10. The voltage controlled oscillator according to claim 8, wherein
the first rectifying circuit includes a first NMOS transistor whose gate and whose drain are electrically connected to each other and whose source is electrically connected to the first node,
the second rectifying circuit includes a first PMOS transistor whose gate and whose drain are electrically connected to each other and whose source is electrically connected to the first node,
the third rectifying circuit includes a second NMOS transistor whose gate and whose drain are electrically connected to each other and whose source is electrically connected to the second node, and
the fourth rectifying circuit includes a second PMOS transistor whose gate and whose drain are electrically connected to each other and whose source is electrically connected to the second node.

11. The voltage controlled oscillator according to claim 8, wherein
the first rectifying circuit includes a first diode whose cathode is electrically connected to the first node,
the second rectifying circuit includes a second diode whose anode is electrically connected to the first node,
the third rectifying circuit includes a third diode whose cathode is electrically connected to the second node, and
the fourth rectifying circuit includes a fourth diode whose anode is electrically connected to the second node.

12. A low pass filter, comprising:
a plurality of semiconductor devices, the semiconductor device according to claim 1; and
a third capacitive element including one end that is electrically connected to a first signal node of the semiconductor device and the other end that is electrically connected to a second signal node of the semiconductor device.

13. The low pass filter according to claim 12, wherein
the first switch includes a control terminal that is electrically connected to a first control node,
the first rectifying circuit is electrically inserted between the first node and a second control node,
the second rectifying circuit is electrically inserted between the first node and the second control node,
the third rectifying circuit is electrically inserted between the second node and the second control node, and
the fourth rectifying circuit is electrically inserted between the second node and the second control node.

14. The low pass filter according to claim 12, wherein
the first rectifying circuit includes a first NMOS transistor whose gate and whose drain are electrically connected to each other and whose source is electrically connected to the first node,
the second rectifying circuit includes a first PMOS transistor whose gate and whose drain are electrically connected to each other and whose source is electrically connected to the first node,
the third rectifying circuit includes a second NMOS transistor whose gate and whose drain are electrically connected to each other and whose source is electrically connected to the second node, and
the fourth rectifying circuit includes a second PMOS transistor whose gate and whose drain are electrically connected to each other and whose source is electrically connected to the second node.

15. The low pass filter according to claim 12, wherein
the first rectifying circuit includes a first diode whose cathode is electrically connected to the first node,
the second rectifying circuit includes a second diode whose anode is electrically connected to the first node,
the third rectifying circuit includes a third diode whose cathode is electrically connected to the second node, and
the fourth rectifying circuit includes a fourth diode whose anode is electrically connected to the second node.

16. A band pass filter, comprising:
a plurality of semiconductor devices, the semiconductor device according to claim 1; and
an inductor element including one end that is electrically connected to a first signal node of the semiconductor device and the other end that is electrically connected to a second signal node of the semiconductor device; and
a third capacitive element including one end that is electrically connected to the first signal node of the semiconductor device and the other end that is electrically connected to the second signal node of the semiconductor device.

17. The band pass filter according to claim 16, wherein
the first switch includes a control terminal that is electrically connected to a first control node,
the first rectifying circuit is electrically inserted between the first node and a second control node,
the second rectifying circuit is electrically inserted between the first node and the second control node,
the third rectifying circuit is electrically inserted between the second node and the second control node, and
the fourth rectifying circuit is electrically inserted between the second node and the second control node.

18. The band pass filter according to claim 16, wherein
the first rectifying circuit includes a first NMOS transistor whose gate and whose drain are electrically connected to each other and whose source is electrically connected to the first node,
the second rectifying circuit includes a first PMOS transistor whose gate and whose drain are electrically connected to each other and whose source is electrically connected to the first node,
the third rectifying circuit includes a second NMOS transistor whose gate and whose drain are electrically connected to each other and whose source is electrically connected to the second node, and
the fourth rectifying circuit includes a second PMOS transistor whose gate and whose drain are electrically connected to each other and whose source is electrically connected to the second node.

19. The band pass filter according to claim 16, wherein
the first rectifying circuit includes a first diode whose cathode is electrically connected to the first node,
the second rectifying circuit includes a second diode whose anode is electrically connected to the first node,
the third rectifying circuit includes a third diode whose cathode is electrically connected to the second node, and
the fourth rectifying circuit includes a fourth diode whose anode is electrically connected to the second node.

* * * * *